United States Patent
Inoue et al.

(10) Patent No.: US 9,136,192 B2
(45) Date of Patent: Sep. 15, 2015

(54) WARP CORRECTION DEVICE AND WARP CORRECTION METHOD FOR SEMICONDUCTOR ELEMENT SUBSTRATE

(75) Inventors: Kouichi Inoue, Ama-gun (JP); Kazuyoshi Maeda, Ama-gun (JP); Norihito Shibuya, Ama-gun (JP)

(73) Assignee: SINTOKOGIO, LTD., Nagoya-shi, Aichi (JP)

( * ) Notice: Subject to any disclaimer, the term of this patent is extended or adjusted under 35 U.S.C. 154(b) by 15 days.

(21) Appl. No.: 14/353,895

(22) PCT Filed: Jul. 13, 2012

(86) PCT No.: PCT/JP2012/067989
§ 371 (c)(1),
(2), (4) Date: Apr. 24, 2014

(87) PCT Pub. No.: WO2013/145348
PCT Pub. Date: Oct. 3, 2013

(65) Prior Publication Data
US 2014/0287538 A1 Sep. 25, 2014

(30) Foreign Application Priority Data
Mar. 30, 2012 (JP) ................... 2012-078890

(51) Int. Cl.
*H01L 23/58* (2006.01)
*H01L 29/10* (2006.01)
(Continued)

(52) U.S. Cl.
CPC ............. *H01L 22/26* (2013.01); *H01J 37/3171* (2013.01); *H01L 21/265* (2013.01);
(Continued)

(58) Field of Classification Search
CPC .............. H01L 21/02002; H01L 21/67; H01L 21/67288; H01L 2924/3511
USPC ............... 257/48, E21.53, E21.521, E21.525, 257/E21.529; 118/712
See application file for complete search history.

(56) References Cited

U.S. PATENT DOCUMENTS 4,820,650 A 4/1989 Nagae et al.
5,851,929 A * 12/1998 Thakur et al. ................. 438/795
(Continued)

FOREIGN PATENT DOCUMENTS

EP 525455 A2 2/1993
EP 1139424 A2 10/2001
(Continued)

OTHER PUBLICATIONS

A. Dübotzky et al., "Evaluation of Alternative Preparation Methods for Failure Analysis at Modern Chip- and Package Technologies," XP-002675679 Proceeding from the 27th International Symposium for Testing and Failure Analysis, Nov. 11-15, 2001, Santa Clara, California, pp. 83-86.

*Primary Examiner* — Kyoung Lee
*Assistant Examiner* — Joannie A Garcia
(74) *Attorney, Agent, or Firm* — Drinker Biddle & Reath LLP (57) ABSTRACT

A warp correction apparatus includes an injection mechanism including a nozzle that performs injection treatment, an adsorption table that holds the substrate by adsorption at a principal surface side or a film surface side, a moving mechanism that moves the adsorption table so that the substrate relatively moves with respect to an injection area of an injection particle by the nozzle, an injection treatment chamber that houses the substrate held on the adsorption table and in the interior of which injection treatment is performed, a measurement mechanism that measures a warp of the substrate, and a control device that, based on a difference between a target warp amount and a warp amount measured by the measurement mechanism, performs at least either one of a setting processing of an injection treatment condition of the injection mechanism and an accept/reject determination of the substrate for which injection treatment has been performed.

12 Claims, 9 Drawing Sheets

(51) Int. Cl.
*H01L 21/66* (2006.01)
*H01L 21/67* (2006.01)
*H01L 21/683* (2006.01)
*H01J 37/317* (2006.01)
*H01L 21/265* (2006.01)
*H01L 33/00* (2010.01)

(52) U.S. Cl.
CPC ...... *H01L21/67288* (2013.01); *H01L 21/6838* (2013.01); *H01L 22/20* (2013.01); *H01L 33/0095* (2013.01); *H01L 22/12* (2013.01); *H01L 2924/0002* (2013.01)

(56) References Cited

U.S. PATENT DOCUMENTS

2006/0216025 A1* 9/2006 Kihara et al. .................. 396/611
2007/0272680 A1* 11/2007 Tadokoro et al. ............. 219/494
2008/0102209 A1* 5/2008 Sasaki et al. .................. 427/294
2009/0214963 A1* 8/2009 Tadokoro et al. ............... 430/30

FOREIGN PATENT DOCUMENTS

| | | |
|---|---|---|
| JP | S63-124534 A | 5/1988 |
| JP | H05-29323 A | 2/1993 |
| JP | 2001-284402 A | 10/2001 |
| JP | 2003-128499 A | 5/2003 |
| JP | 2003-300800 A | 10/2003 |
| JP | 2004-165226 A | 6/2004 |
| JP | 2005-136167 A | 5/2005 |
| JP | 2010-165817 A | 7/2010 |
| JP | 2010-205888 A | 9/2010 |
| JP | 2011-222608 A | 11/2011 |
| JP | 2011-238731 A | 11/2011 |

* cited by examiner

WARP CORRECTION DEVICE AND WARP CORRECTION METHOD FOR SEMICONDUCTOR ELEMENT SUBSTRATE

TECHNICAL FIELD

The present invention relates to a warp correction apparatus and warp correction method for a semiconductor element substrate for correcting a warp produced in the semiconductor element substrate such as a sapphire substrate.

BACKGROUND ART

A semiconductor element such as a light-emitting diode is manufactured by forming a semiconductor film, for example, a GaN-based compound semiconductor film, by epitaxial crystal growth on a principal surface (polished surface) of a semiconductor element substrate made of sapphire or the like, and forming electrodes and others. The semiconductor layer is formed heating the semiconductor element substrate, and is thereafter cooled to room temperature. Therefore, a warp that is convex to the semiconductor film side is produced during cooling due to a difference in thermal expansion between the semiconductor element substrate and the semiconductor film.

In order to correct this warp, for example, cited document 1 discloses a technique for correcting a warp using a large-sized press device that is for pressing at a pressure of $4.9 \times 10^4$ to $4.9 \times 10^6$ Pa. Moreover, cited document 2 discuses a technique for correcting a warp through modification of the interior of a sapphire substrate by converging and scanning pulsed laser light on the interior.

CITATION LIST

Patent Literature

Patent Document 1: Japanese Patent Application Laid-Open No. 2003-128499
Patent Document 2: Japanese Patent Application Laid-Open No. 2010-165817

SUMMARY OF INVENTION

Technical Problem

With the technique described in cited document 1, it is necessary to provide a press mechanism in an MOCVD device for performing epitaxial growth, which results in an increase in device costs and is not suitable for mass production. Moreover, it is also likely under the request for an increase in the size of semiconductor element substrates for the purpose of mass production that cracks or the like of semiconductor element substrates occur with increased frequency during pressing to lower the yield.

With the technique described in cited document 2, a high surface roughness is required for irradiating the interior of a sapphire substrate with laser light, which thus resets in an increased load on the polishing step. Moreover, a high positional accuracy is required in order to irradiate a predetermined position with laser light, which thus results in an increase in device costs. Moreover, when a semiconductor element substrate is modified by irradiation with laser light after film formation, because the warp amount changes according to the quality and material, thickness, and others of a film to be formed or variation in the warp amount occurs even under the same film forming conditions, it is likely that the warp correction amount is not stabilized even when laser irradiation conditions are fixed and the yield does not improve.

In the present technical field, there has been a demand for a warp correction apparatus and warp correction method for a semiconductor element substrate capable of correcting a warp of a semiconductor element substrate efficiently by a method suitable for mass production.

Solution to Problem

An apparatus according to an aspect of the present invention is a warp correction apparatus that corrects a warp of a semiconductor element substrate, and includes an injection mechanism having a nozzle that performs injection treatment of injecting an injection particle to a rear surface that is opposite to a principal surface or opposite to a film surface in the semiconductor element substrate, an adsorption table that adsorbs the principal surface or the film surface of the semiconductor element substrate to hold the semiconductor element substrate, a moving mechanism that moves the adsorption table so that the semiconductor element substrate relatively moves with respect to an injection area of the injection particle by the nozzle, an injection treatment chamber that houses the semiconductor element substrate held on the adsorption table and in an interior of which injection treatment is performed, a measurement mechanism that measures a warp amount of the semiconductor element substrate, and a control device that, based on a difference between a previously set target warp amount and the warp amount of the semiconductor element substrate measured by the measurement mechanism, performs at least either one of a setting processing of an injection treatment condition of the injection mechanism and an accept/reject determination of the semiconductor element substrate for which injection treatment has been performed.

The apparatus according to an aspect of the present invention consists of means of low device costs including the injection mechanism, and can perform injection treatment in which appropriate injection treatment conditions are set based on the previously set target warp amount and the warp amount of the semiconductor element substrate measured by the measurement mechanism to correct the warp of the semiconductor element substrate. Therefore, by the apparatus, the warp of the semiconductor element substrate can be corrected efficiently by a method suitable for mass production. Moreover, the apparatus can measure by the measurement mechanism the warp amount of the semiconductor element substrate for which injection treatment has been performed and perform an accept/reject determination to judge whether the warp amount is no more than the target warp amount (within the permissible range of the target warp amount), and can thus improve the yield and efficiently perform the warp correction processing.

In an embodiment, the adsorption table may include an adsorption portion that is provided in a region where the semiconductor element substrate is to be placed, and adsorbs and fixes the semiconductor element substrate, and a purge portion that is provided in the region and at an outer edge side of the region further than the adsorption portion, and injects compressed air toward outside the region from a clearance formed between an outer edge of the semiconductor element substrate and the adsorption table.

The semiconductor element substrate that is in a state fixed by being adsorbed to the adsorption table is warped. Therefore, a clearance is created between the semiconductor element substrate and the adsorption table at an outer peripheral edge portion of the semiconductor element substrate, into which the injection particle enters to damage the film surface for which a semiconductor film is formed on the principal surface of the semiconductor element substrate or the principal surface. By the invention according to an embodiment, because compressed air is injected toward outside of the region where the semiconductor element substrate is placed from the clearance between the semiconductor element substrate and the adsorption table by the purge portion, entry of the injection particle into the clearance can be prevented. Therefore, damage to the semiconductor element substrate by the injection particle can be prevented.

In an embodiment, the adsorption table may include an adsorption portion that is provided at a position corresponding to at least a region that is an outer edge of the semiconductor element substrate and where no semiconductor elements are formed, and adsorbs and fixes the semiconductor element substrate.

As a result of this arrangement, the semiconductor element substrate can be adsorbed and held in the region that is an outer edge (the vicinity of an outer periphery) of the semiconductor element substrate and where no semiconductor elements are formed, so that damage to the semiconductor elements due to entry of the injection particle can be prevented.

In an embodiment, at least either one of the injection mechanism and the adsorption table may relatively scan the semiconductor element substrate with respect to the injection area of the injection particle by the nozzle so that the injection particle is injected over the entire rear surface of the semiconductor element substrate.

As a result of this arrangement, by injecting the injection particle over the entire rear surface in the injection treatment, collision energy by the injection particle can be caused to work on the semiconductor element substrate as a whole, so that the warp can be effectively corrected.

In an embodiment, in one side surface of the injection treatment chamber, a suction portion that sucks and removes the injection particle may be provided, in the other side surface of the injection treatment chamber, an opening portion through which the adsorption table holding the semiconductor element substrate passes may be formed, and the opening portion may be opened at a size that forms a gap to suck outside air with the adsorption table or the semiconductor element substrate when the adsorption table holding the semiconductor element substrate is inserted.

As a result of this arrangement, an air current heading for the suction portion from the opening portion is generated by outside air sucked through the suction portion. Hence, the injection particle injected by the injection mechanism heads for the suction portion without going around to the principal surface or film surface of the semiconductor element substrate. Such a situation that the principal surface or the film surface is damaged by the injection particle and the injection particle adheres can thereby be avoided. Moreover, leakage of the injection particle to the exterior of the injection treatment chamber from the opening portion can be avoided.

In an embodiment, an interior of the injection treatment chamber may be partitioned by a wall portion formed with a slit not to obstruct a movement of the semiconductor element substrate. In an embodiment, the adsorption table may be arranged so as to be movable in a horizontal plane by the moving mechanism, the wall portion may be coupled at both end portions thereof in a vertical direction with an upper surface and bottom portion of the injection treatment chamber as well as disposed surrounding the injection area of the nozzle, and the slit may be formed at a position to overlap a horizontal plane in which the adsorption table is movable.

As a result of this arrangement, diffusion of the injection particle in the entire injection treatment chamber can be prevented by the wall portion. Moreover, by the slit, obstruction of the operation to treat the semiconductor element substrate can be avoided.

In an embodiment, the apparatus may include a cleaning mechanism that is provided on a side surface of an opening portion side of the injection treatment chamber, and for removing the injection particle adhered to the semiconductor element substrate. As a result of this arrangement, when taking the semiconductor element substrate out of the injection treatment chamber, the injection particle adhered to the front surface of the semiconductor element substrate can be removed by the cleaning mechanism. Hence, leakage of the injection particle to the outside of the injection treatment chamber can be avoided.

In one embodiment, the control device may cause the injection mechanism to operate so as to perform injection treatment again when having judged, in the accept/reject determination, that the warp of the semiconductor element substrate for which injection treatment has been performed is greater than the target warp amount.

As a result of this arrangement, when the warp amount of the semiconductor element substrate is measured after the warp correction processing and is judged to be greater than the target warp amount, the warp correction processing is performed again, so that the yield can be improved and the warp correction processing can be efficiently performed.

In an embodiment, the control device may cause the injection mechanism to operate so as to perform a coarse correction processing of setting an injection treatment condition based on a provisional target warp amount greater than the target warp amount to perform injection treatment and a finish correction processing of setting the injection treatment condition based on the target warp amount after the coarse correction processing to perform injection treatment. As a result of this arrangement, the processing efficiency can be improved in the coarse correction processing and the correction accuracy can be secured by the finish correction processing.

A method according to another aspect of the present invention is a warp correction method for a semiconductor element substrate using a warp correction apparatus for a semiconductor element substrate including a measurement mechanism that is for measuring a warp amount of a semiconductor element substrate, a control device that is for calculating a difference between a previously set target warp amount and warp amount data of the semiconductor element substrate measured by the measurement mechanism, and performing at least either one of setting of an injection condition for performing a warp correction processing of correcting a warp of the semiconductor element substrate by injecting an injection particle to a rear surface and an accept/reject determination of the semiconductor element substrate for which the warp correction processing has been performed, and an injection mechanism including a nozzle that is for performing injection treatment of injecting the injection particle to a rear surface that is opposite to a principal surface or opposite to a film surface in the semiconductor element substrate. This method includes a step of measuring the warp amount of the semiconductor element substrate by the measurement mechanism, a step of calculating the difference between warp amount data measured by the measurement mechanism and the previously set target warp amount, and setting the injection treatment condition, a step of performing the warp correction processing by injecting the injection particle toward the rear surface that is opposite to the principal surface or opposite to the film surface of the semiconductor element substrate on the injection treatment condition, and a step of determining whether the warp amount of the semiconductor element substrate for which the warp correction processing has been performed is no more than the previously set target warp amount.

Moreover, a method according to still another aspect of the present invention is a warp correction method for a semiconductor element substrate using the foregoing warp correction apparatus for a semiconductor element substrate, and includes a step of measuring the warp amount of the semiconductor element substrate by the measurement mechanism, a step of conveying onto the adsorption table the semiconductor element substrate the warp amount of which has been measured, and holding the semiconductor element substrate on the adsorption table, a step of setting the injection treatment condition of the injection mechanism based on the difference between the warp amount measured by the measurement mechanism and the previously set target warp amount, a step of performing a warp correction processing by injecting the injection particle toward the rear surface that is opposite to the principal surface or opposite to the film surface of the semiconductor element substrate on the injection treatment condition, a step of conveying to the measurement mechanism the semiconductor element substrate for which the warp correction processing has been performed, and measuring the warp amount of the semiconductor element substrate, and a step of determining whether the warp amount of the semiconductor element substrate for which the warp correction processing has been performed is no more than the previously set target warp amount.

By the abovementioned method, the warp of the semiconductor element substrate can be corrected without the necessity for a complicated processing step. The manufacturing costs of the warp correction apparatus can thereby be lowered. Moreover, the warp correction apparatus can be reduced in size.

In an embodiment, the warp amount of the semiconductor element substrate may be calculated by computing by measuring heights from three to six reference positions for one straight line. As a result of this arrangement, the warp amount of the semiconductor element substrate can be measured with a small number of measurement points, so that the processing time can be reduced.

In an embodiment, the step of performing the warp correction processing may be performed before a step of forming a resist film to form a circuit pattern on a thin-film layer formed on the semiconductor element substrate. As a result of this arrangement, the resist film is formed on the semiconductor element substrate the warp of which has been corrected, so that the circuit pattern can be more precisely formed.

Advantageous Effects of Invention

Various aspects and embodiments of the present invention provide a warp correction apparatus and warp correction method for a semiconductor element substrate capable of correcting a warp of a semiconductor element substrate efficiently by a method suitable for mass production.

BRIEF DESCRIPTION OF DRAWINGS

FIG. 6(A) is an explanatory longitudinal sectional view, FIG. 6(B) is a B-B sectional view of FIG. 6(A), and FIG. 6(C) is a C-C sectional view of FIG. 6(A).

DESCRIPTION OF EMBODIMENTS

A warp correction apparatus according to an embodiment will be described with reference to the figures. The warp correction apparatus is an apparatus for correcting a warp by, for example, injecting an injection particle to a semiconductor element substrate.

The semiconductor element substrate a warp of which is corrected by the warp correction apparatus is, for example, a substrate made of sapphire, SiC, GaAS, GaP, GaAlAs, or the like, and is a substrate to form on a principal surface of which a semiconductor film, for example, a GaN-based compound semiconductor film, and form semiconductor elements such as light-emitting diode (LED) elements or laser diode (LD) elements.

Figure 1:
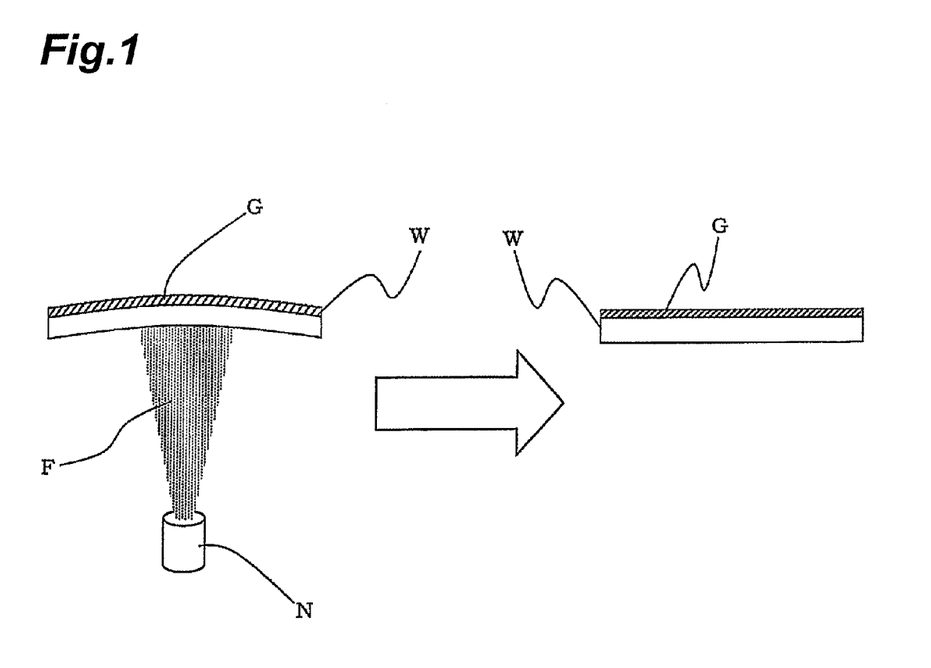
FIG. 1 is an explanatory view showing a principal of a warp correction method for a semiconductor element substrate.

FIG. 1 shows a conceptual view of a method for correcting a warp of a semiconductor element substrate by injection treatment. A semiconductor element substrate W, such as a sapphire wafer, formed with a semiconductor film G made of a GaN-based compound or the like has a warp produced such as to be convex at its film surface side where the semiconductor film G is formed on the principal surface. By injecting an injection particle F by a nozzle N to the rear surface side of the semiconductor element substrate W with a warp to cause a collision, the warp can be corrected without causing damage to the film surface or principal surface of the semiconductor element substrate W.

Figure 2:
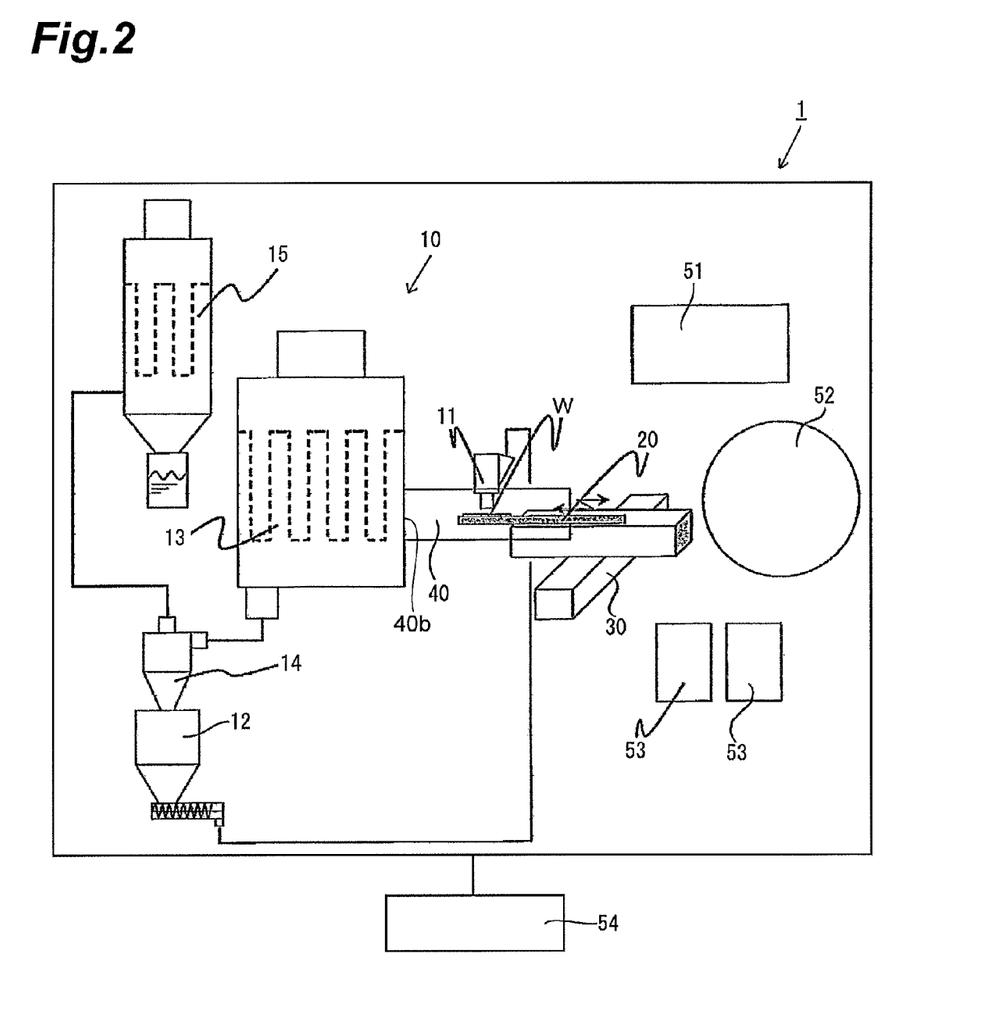
FIG. 2 is a schematic view showing a configuration of a warp correction apparatus for a semiconductor element substrate.

As shown in FIG. 2, the warp correction apparatus 1 for a semiconductor element substrate according to the embodiment includes, for example, an injection mechanism 10, a conveying mechanism 52, an adsorption table 20, a moving mechanism 30, a measurement mechanism 51, an injection treatment chamber 40, a suction portion 40b, and a control device 54. The injection mechanism 10 includes a nozzle 11 that is for performing injection treatment to inject an injection particle to the semiconductor element substrate W. The conveying mechanism 52 conveys the semiconductor element substrate W. The conveying mechanism 52 conveys the semiconductor element substrate W, for example, between the measurement mechanism 51 and the injection treatment chamber 40. The adsorption table 20 adsorbs the film surface or principal surface of the semiconductor element substrate W to hold the semiconductor element substrate W. The moving mechanism 30 moves the adsorption table 20 so that the semiconductor element substrate W relatively moves with respect to an injection area of an injection particle by the nozzle 11. The measurement mechanism 51 measures the warp amount of the semiconductor element substrate W. The injection treatment chamber 40 houses the semiconductor element substrate W held on the adsorption table 20. In the interior of the injection treatment chamber 40, injection treatment is performed. The suction portion 40$b$ sucks and removes the injection particle from a side surface direction of the adsorption table 20 in the injection treatment chamber 40. The control device 54 controls the operation of the above-mentioned respective devices and the like. As the control device 54, for example, various computing devices such as personal computers, motion controllers such as programmable logic controllers (PLCs) and digital signal processors (DSPs), sophisticated mobile devices and sophisticated mobile phones, etc., can be used. The semiconductor element substrates W are housed in cases 53 with a distinction between before and after a warp correction processing.

The injection mechanism 10 includes a nozzle 11 and a reserve tank (not shown) that reserves an injection particle. Moreover, the injection mechanism 10 includes, for example, an injection particle hopper 12, an air compressor (not shown), a recovery unit 13, a classifier 14, and a dust collector 15. The injection particle hopper 12 quantitatively feeds a predetermined amount of the injection particle to the nozzle 11. The air compressor feeds compressed air to the nozzle 11. The recovery unit 13 is connected with the suction portion 40$b$ to recover the injection particle after injection treatment. The classifier 14 classifies the injection particle recovered by the recovery unit 13 into a usable injection particle and a non-usable injection particle. The dust collector 15 exhausts and removes dust from the classifier 14.

Figure 3:
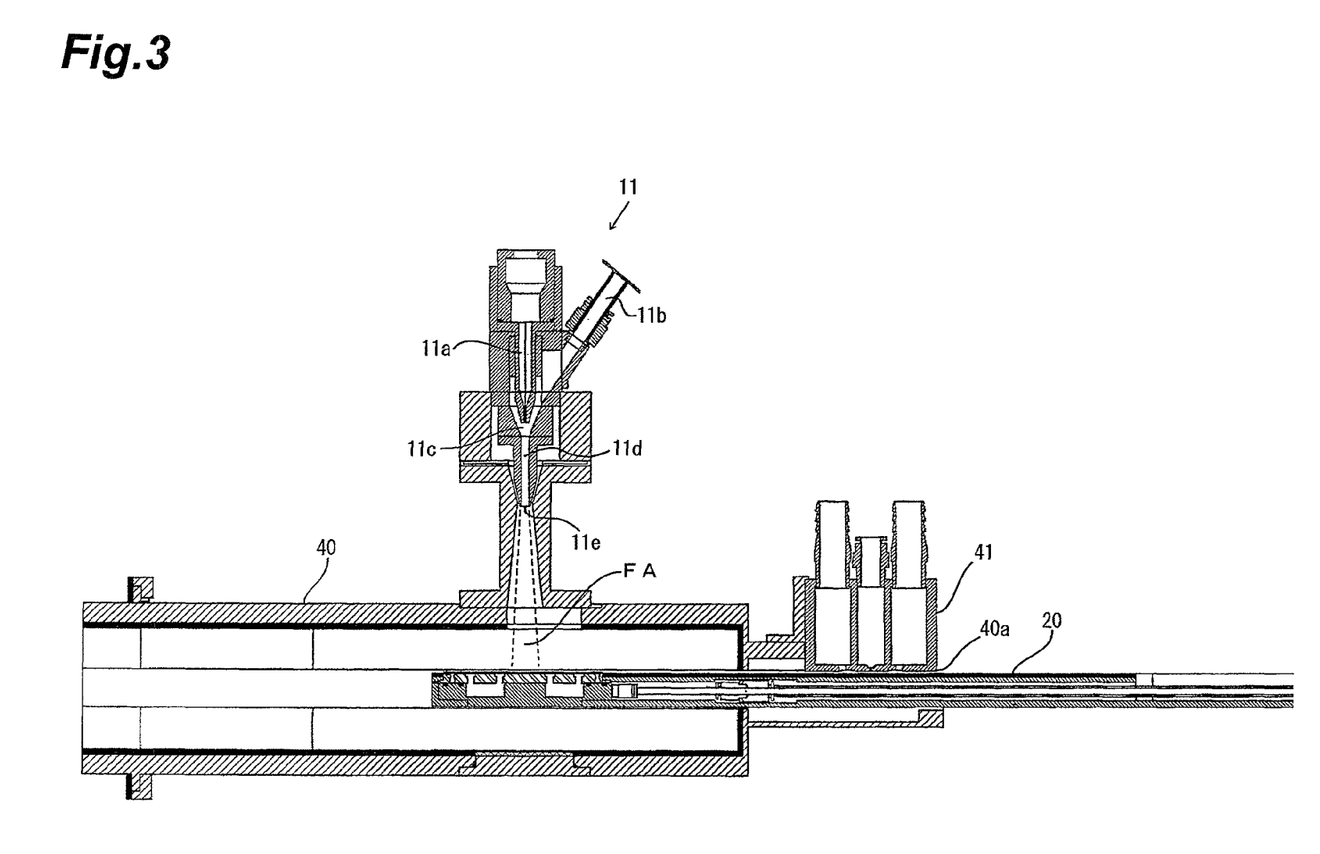
FIG. 3 is an explanatory longitudinal sectional view showing a positional relationship of a nozzle, an adsorption table, and an injection treatment chamber when performing injection treatment and structures of those.

As shown in FIG. 2 and FIG. 3, the nozzle 11 includes a gas injection portion 11$a$, a feed port 11$b$, a mixing chamber 11$c$, and an injection particle injection portion 11$d$. The gas injection portion 11$a$ is connected with the air compressor. The feed port 11$b$ is connected with the injection particle hopper 12 and feeds the injection particle. The mixing chamber 11$c$ communicates respectively with the gas injection portion 11$a$ and the feed port 11$b$, and mixes compressed air fed from the gas injection portion 11$a$ and the injection particle fed from the feed port 11$b$ to form a solid-gas two-phase flow. The injection particle injection portion 11$d$ injects the solid-gas two-phase flow introduced from the mixing chamber 11$c$ to a workpiece. The nozzle 11 is disposed on an upper surface of the injection treatment chamber 40 so as to be capable of injecting vertically downward, and can perform injection treatment for the semiconductor element substrate W fixed by adsorption to the adsorption table 20. In the present embodiment, a nozzle 11 in which an injection port 11$e$ is formed in an oblong shape is adopted. Because the area to be injected with the injection particle by one time of scanning can thereby be increased, the efficiency of the injection treatment can be improved.

The injection treatment of the injection particle by the injection mechanism 10 is performed by the following procedure. When compressed air is fed to the gas injection portion 11$a$ of the nozzle 11, the compressed air is injected toward the injection particle injection portion 11$d$ from the tip. The injection particle is controlled in feeding amount by the injection particle hopper 12, and by a negative pressure generated when the compressed air passes through the mixing chamber 11$c$ from the gas injection portion 11$a$, the injection particle is fed to the mixing chamber 11$c$ from the feed port 11$b$. The injection particle fed to the mixing chamber 11$c$ is mixed with the compressed air injected from the gas injection portion 11$a$ to be accelerated, passes through the injection particle injection portion 11$d$, and is injected against the semiconductor element substrate W from the injection port 11$e$.

Figure 4:
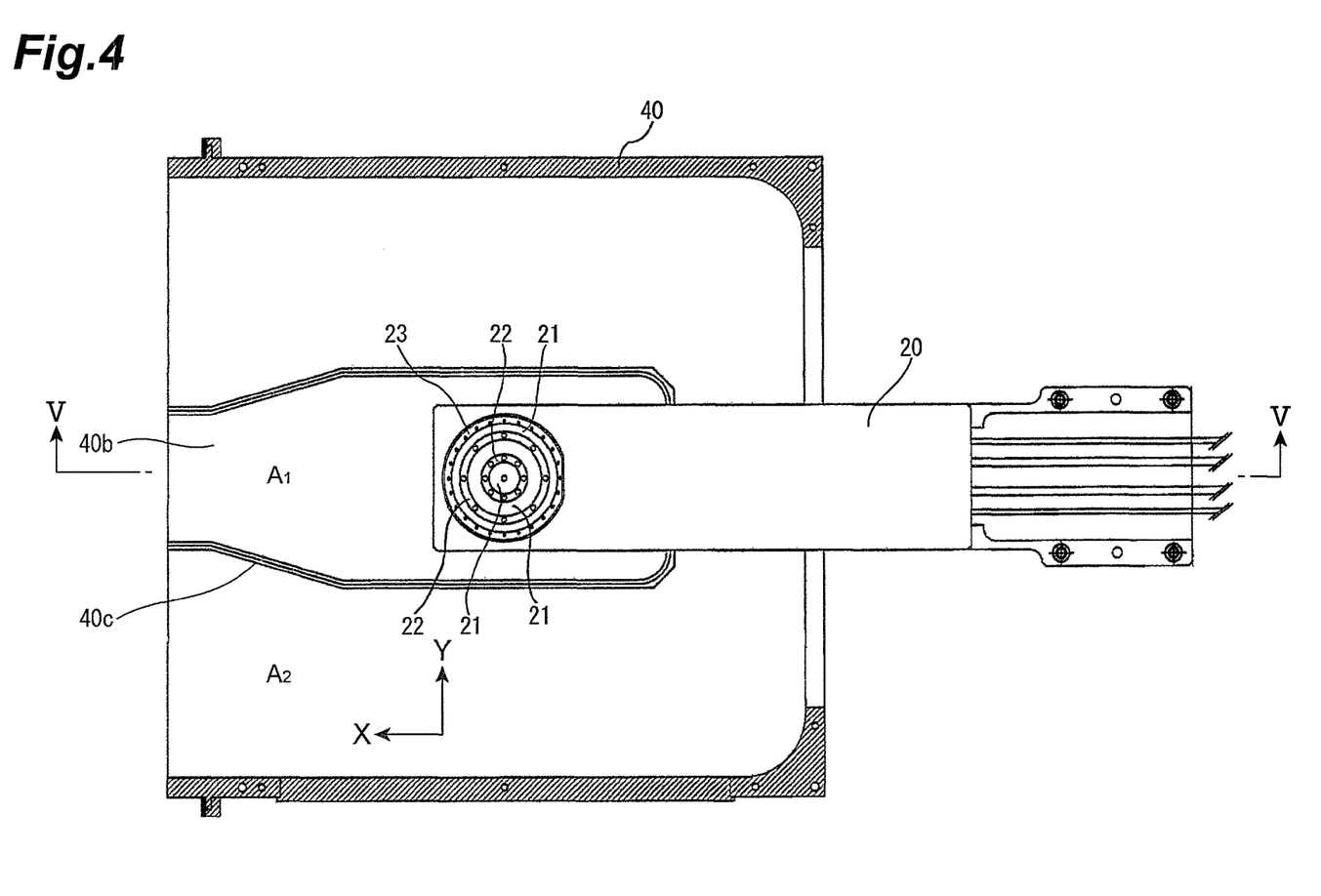
FIG. 4 is an explanatory plan view showing an internal structure of the injection treatment chamber.
Figure 6:
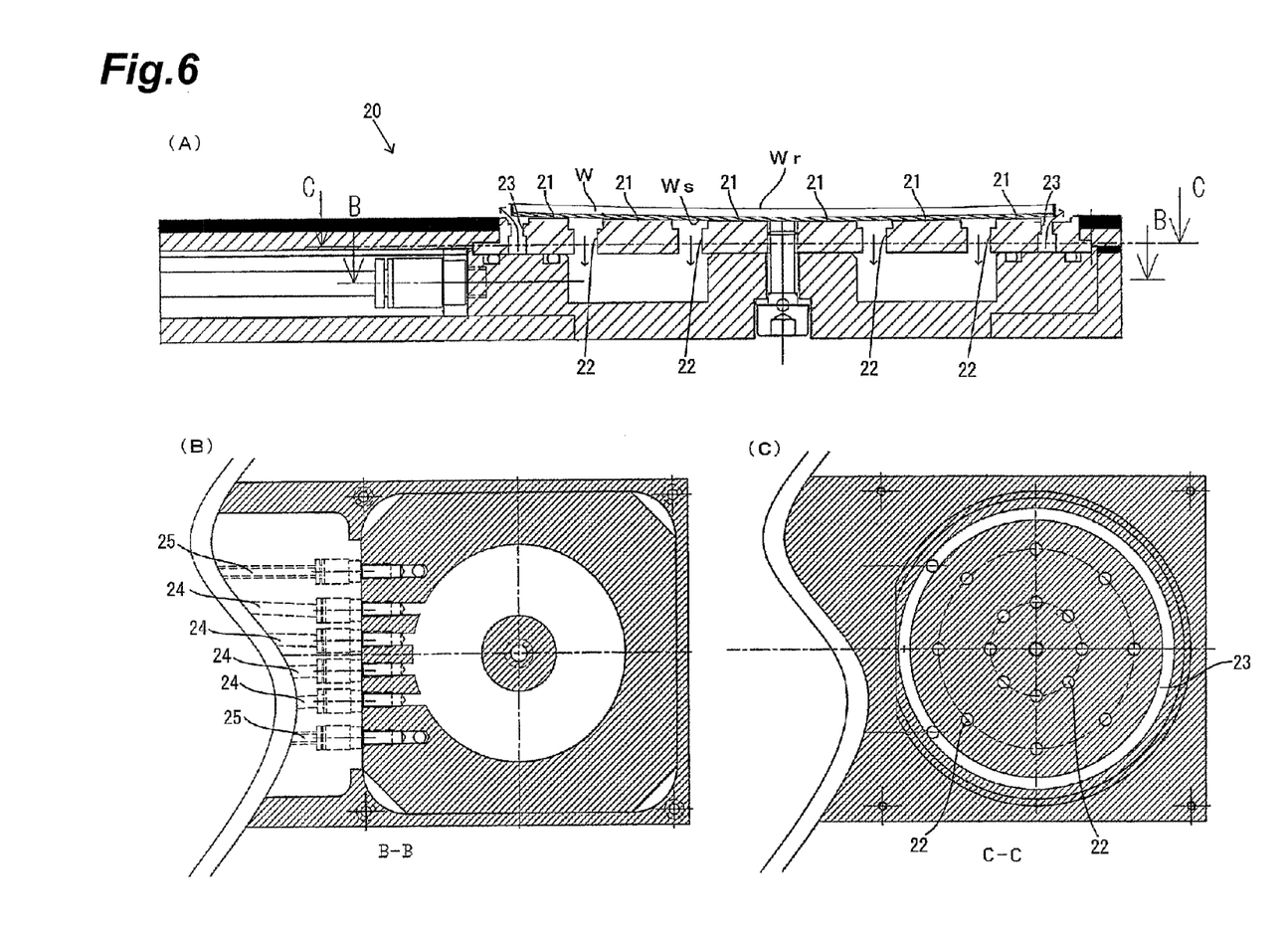
FIG. 6 includes explanatory views showing a structure of the adsorption table.

As shown in FIG. 4 and FIG. 6, the adsorption table 20 is formed in a thin rectangular parallelepiped shape a horizontal plane of which is in an oblong shape. An end portion of the adsorption table 20 is attached to the moving mechanism 30, and on an upper surface (region where a semiconductor element substrate is to be placed) of the other end portion at the side opposite thereto, an adsorption portion 21 that adsorbs the semiconductor element substrate W is provided. The adsorption portion 21 is formed of, for example, a polyetheretherketone (PEEK) material so as not to cause an adsorption mark on an adsorption surface of the semiconductor element substrate W. Besides the PEEK material, nitrile rubber, silicon rubber, fluorine-containing rubber, and the like can be considered, but the material is not particularly limited as long as it does not cause an adsorption mark. A negative pressure portion 22 is provided adjacent to the adsorption portion 21. The negative pressure portion 22 includes openings arrayed in, for example, a concentric circular configuration. Here, the negative pressure portion 22 is formed so as to be a double concentric circle at the position of openings. The negative pressure portion 22 communicates with suction tubes 24 to generate a negative pressure, and sucks the semiconductor element substrate W to fix the same to the adsorption portion 21. In the region where the semiconductor element substrate W is to be placed in the adsorption table 20 and outside of the adsorption portion 21 (at an outer edge side of said region), an annular purge portion 23 is formed. The purge portion 23 communicates with purge tubes 25 that feeds compressed air, and can inject compressed air toward the outside (outside the region) from a clearance formed between an outer edge of the semiconductor element substrate W and the adsorption table 20.

The moving mechanism 30 is a moving mechanism such as for example, an X-Y stage that moves the adsorption table 20 so as to relatively move the semiconductor element substrate W held by being adsorbed on the adsorption table 20 with respect to an injection area FA of an injection particle by the nozzle 11. In the present embodiment, the nozzle 11 is fixed to the injection treatment chamber 40, and as a result of only the adsorption table 20 moving, the semiconductor element substrate W relatively moves with respect to the injection area FA of the injection particle. Here, a direction to insert by the moving mechanism 30 in the interior of the injection treatment chamber 40 is assumed as the X-direction, and a vertical direction horizontal to this insertion direction is assumed as the Y-direction.

Figure 5:
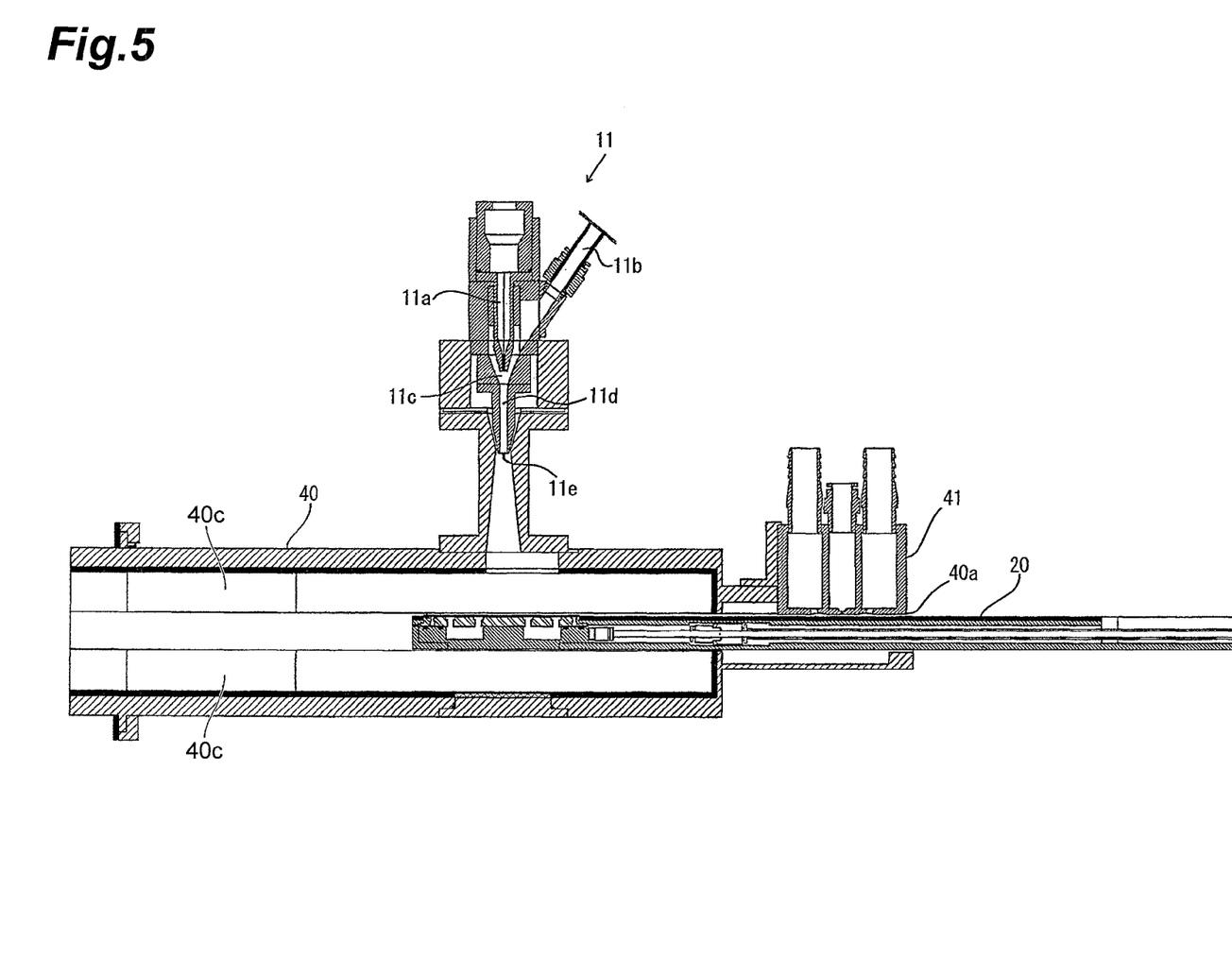
FIG. 5 is a sectional view taken along the line V-V shown in FIG. 4.

As shown in FIG. 3 and FIG. 4, in a side surface of the injection treatment chamber 40, formed is an opening portion (housing port 40$a$) that is for housing in the interior of the injection treatment chamber 40 the semiconductor element substrate W held by being adsorbed on the adsorption table 20, and adjacent to the housing port 40$a$, a cleaning mechanism 41 is provided that blows off by an air blow the injection particle adhered to the semiconductor element substrate W and sucks and removes the same. The injection treatment chamber 40 is directly connected to the recovery unit 13 at a surface opposite to the housing port 40$a$, and is demarcated by a wall portion 40$c$ (refer to FIG. 5) formed with a slit so as not to obstruct a movement in the horizontal direction of the adsorption table 20 (refer to FIG. 9). As shown in FIG. 5, the slit in the wall portion 40$c$ is formed with a width (height direction) so as to be greater than the thickness of the semiconductor element substrate W and the adsorption table 20, as well as so that the difference between the slit width and the combined thickness of the semiconductor element substrate W and adsorption table 20 is small. Moreover, as shown in FIG. 3 and FIG. 4, a suction portion 40b is formed that sucks and removes the injection particle from a side surface of the adsorption table 20.

The housing port 40a is formed in a size such that a gap is formed therewith between both the semiconductor element substrate W and the adsorption table 20 when the adsorption table 20 with the semiconductor element substrate W placed therein is inserted. By a suction force caused by the recovery unit connected to the suction portion 40b, outside air is sucked through the gap. As a result, in the interior of the injection treatment chamber 40, there is generated an air current heading for the suction portion 40b from the housing port 40a. If the housing port 40a is excessively great, pressure loss is large, and it is difficult to suck outside air if the housing port 40a is excessively small, and generation of the air current is hindered in either case. The gap between the housing port 40a and the semiconductor element substrate W can be set to, for example, 0.5 mm to 5.0 mm.

The interior of the injection treatment chamber 40 is demarcated into a space $A_1$ and a space $A_2$ by the wall portion 40c. The wall portion 40c extends in a direction (vertical direction) to be vertical to the X-direction and Y-direction, and is coupled at both end portions thereof with a ceiling surface (upper surface) and bottom portion of the injection treatment chamber 40 as well as disposed surrounding the injection area FA of the injection particle by the nozzle 11. That is, the nozzle 11 is disposed on an upper surface of the space $A_1$, and most of the injection particles injected from said nozzle 11 is blocked by the wall portion 40c to be recovered by the recovery unit without heading for the space $A_2$. The slit is formed, in the wall portion 40c, at a position to overlap a horizontal plane in which the adsorption table 20 is movable.

An air blow to be performed by the cleaning mechanism 41 is not for injecting only compressed air, and other means may be imparted thereto. For example, a slight amount of moisture or an electrostatic remover may be injected together with compressed air, ions or radicals may be injected together with compressed air by corona discharging or the like, or combination with ultrasonic waves may be used (ultrasonic air blow).

The measurement mechanism 51 is a device for measuring a warp of the semiconductor element substrate W, and can adopt a publicly known measurement device such as a laser displacement gauge, a non-contact measurement device using interference fringes, or a contact measurement device such as a probe. In the present embodiment, a laser displacement gauge is adopted.

The conveying mechanism 52 is a means for conveying the semiconductor element substrate W between the case 53, the measurement mechanism 51, and the adsorption table 20, and can adopt, for example, a robot arm or the like.

Figure 7:
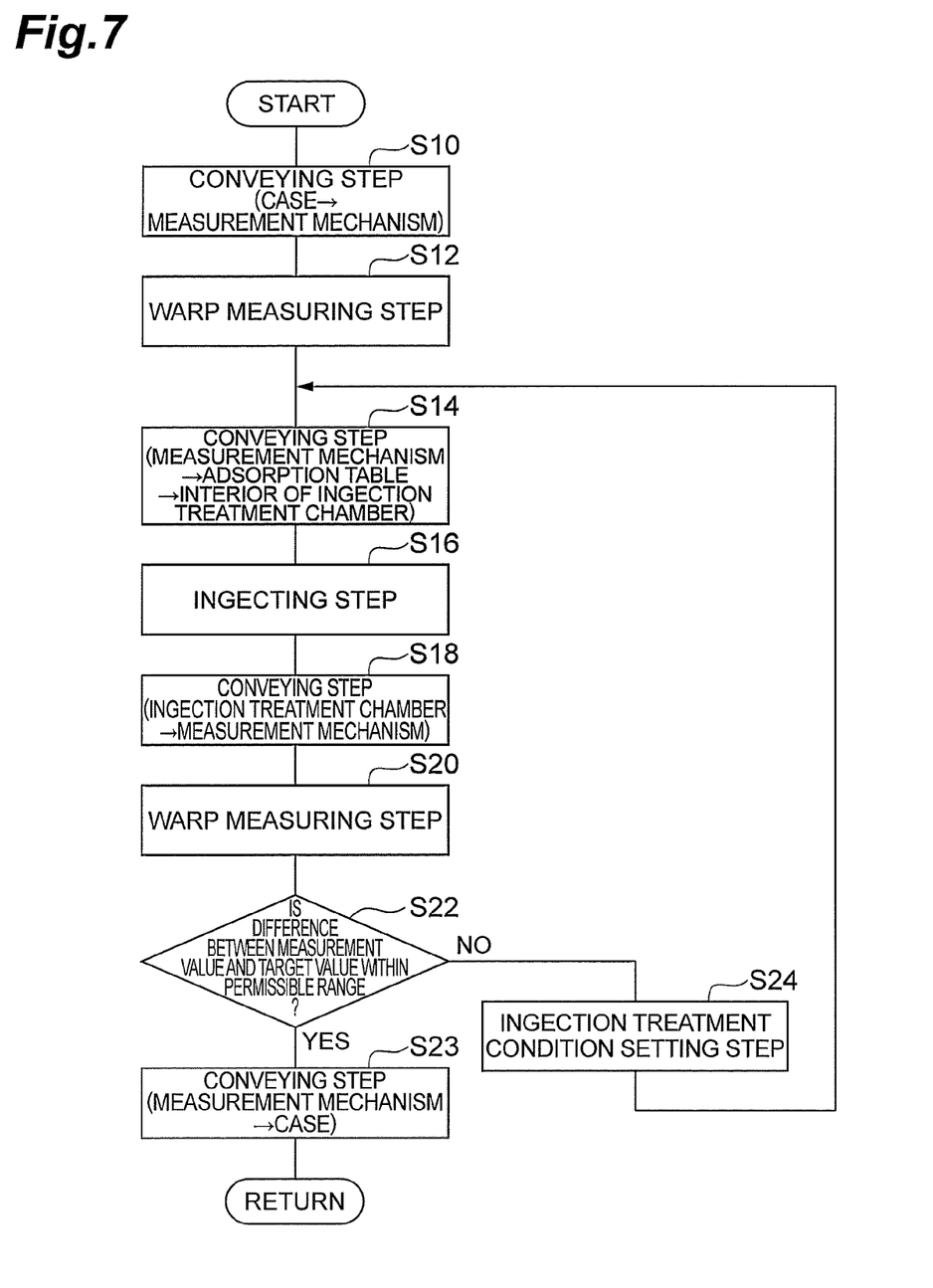
FIG. 7 is a flowchart showing operation of the warp correction apparatus.

Next, a warp correction processing using the warp correction apparatus 1 will be described. FIG. 7 is a flowchart showing operation of the warp correction apparatus 1.

Figure 8:
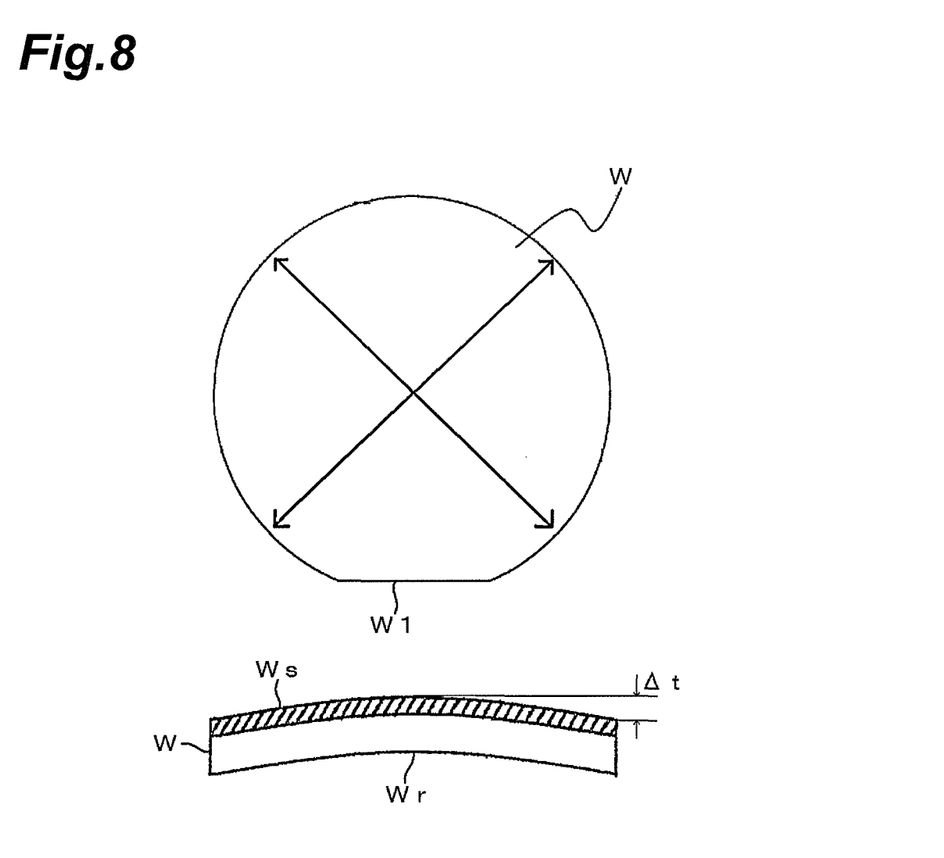
FIG. 8 is a schematic view showing a warp measurement method by a measurement mechanism.

First, a warp of the semiconductor element substrate W formed with a semiconductor film is measured by the measurement mechanism 51 (S10, S12). As shown in FIG. 7, the semiconductor element substrate W is conveyed to the measurement mechanism 51 by the conveying mechanism 52 from a pre-processing case 53 (S10). Then, measurement of a warp of the semiconductor element substrate W is performed. FIG. 8 shows an example of the warp measurement method. As shown in FIG. 8, the semiconductor element substrate W is placed on a measurement stage so that a film surface Ws for which a semiconductor film is formed on the mirror-polished principal surface of the semiconductor element substrate W faces up, a measurement field is scanned from above by a laser displacement gauge to measure the height (S12). For measuring a warp amount more accurately, the measurement is performed from the side of the film surface Ws, but depending on the measurement method or the required measurement accuracy, a measurement from the side of a rear surface Wr that is opposite to the film surface Ws is also possible. The measurement field is, for example, on two straight lines that create angles of 45° with an oriental flat W1 of the semiconductor element substrate W. The warp amount is defined by a difference $\Delta t$ between the maximum height and minimum height of the semiconductor element substrate W. The control device 54 has stored a previously measured and set calibration curve, and calculates a difference of this $\Delta t$ from a previously set target warp amount, and based on the result, injection treatment conditions such as operation of the nozzle 11 are set.

Next, the semiconductor element substrate W is conveyed to the adsorption table 20 by the conveying mechanism 52 (S14). The semiconductor element substrate W is placed so that a film surface Ws for which a semiconductor film is formed on the mirror-polished principal surface makes contact with the adsorption portion 21 of the adsorption table 20, and is adsorbed and fixed by a negative pressure generated in the negative pressure portion 22. At this time, compressed air blows out of the purge portion 23, and the blown-out air flows toward the outside direction from a clearance between the film surface Ws of the semiconductor element substrate W and the adsorption table 20.

Subsequently, the adsorption table 20 is moved by the moving mechanism 30, so that the semiconductor element substrate W is introduced into the injection treatment chamber 40 through the housing port 40a of the injection treatment chamber 40 (S14).

Subsequently, injection treatment is performed by injecting the injection particle through the nozzle 11 and moving the adsorption table 20 by the moving mechanism 30 to scan the semiconductor element substrate W within the injection area FA of the injection particle so that the injection particle is uniformly injected over the entire rear surface Wr (S16). By injecting the injection particle over the entire rear surface Wr in the injection treatment, collision energy by the injection particle can be caused to work on the semiconductor element substrate W as a whole, so that a warp can be effectively corrected. Here, injecting the injection particle substantially vertical to the rear surface Wr allows causing the collision energy to work effectively and preventing the semiconductor element substrate W after injection treatment from swelling and the like.

Figure 9:
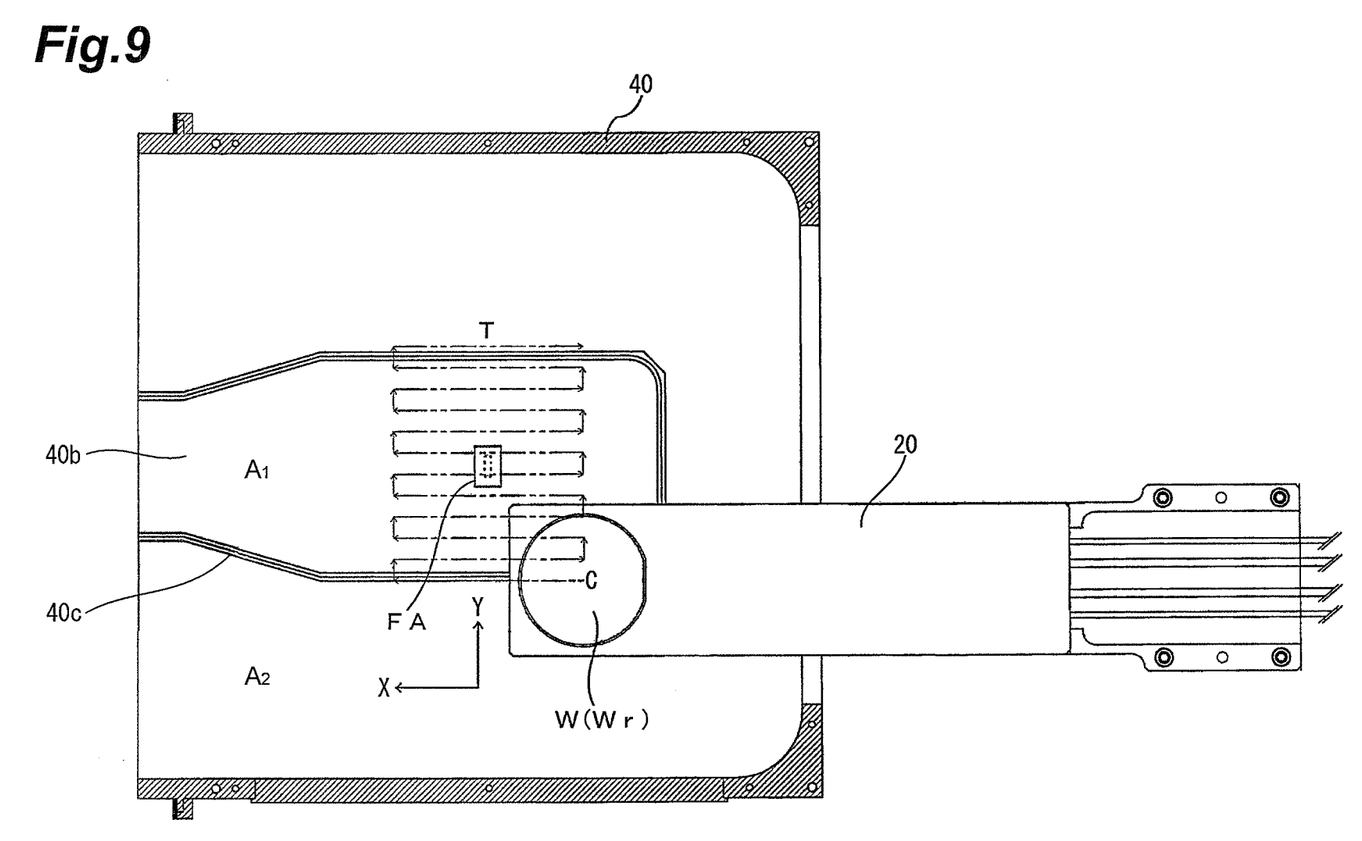
FIG. 9 is a schematic view showing a scanning trajectory of the adsorption table in injection treatment.

As shown in FIG. 9, the scanning trajectory T of the center C of the semiconductor element substrate W is a trajectory of scanning in a comb-teeth shape by repeating scanning in the X-direction from an end portion of the semiconductor element substrate W to the injection area FA of the injection particle and shifting in the Y-direction at a predetermined pitch followed by returning into the X-direction. Here, when the injection port 11e is formed in an oblong shape, the injection width of the injection particle by one time of scanning in the X-direction can be increased by disposing the same so that its long sides are in the Y-direction, so that the efficiency of the injection treatment can be improved.

Because the semiconductor element substrate W that is in a state fixed by being adsorbed to the adsorption table 20 is warped to be convex downward, a clearance is created between the semiconductor element substrate W and the adsorption portion 21 at an outer peripheral edge portion of the semiconductor element substrate W, into which the injection particle enters to damage the film surface Ws. In an embodiment, because compressed air is injected toward the outside from the clearance between the film surface Ws of the semiconductor element substrate W and the adsorption table 20 by the purge portion 23, entry of the injection particle into the clearance can be prevented, so that damage to the film surface Ws can be prevented.

The injection particle injected to the semiconductor element substrate W is sucked and recovered by the recovery unit 13 from the suction portion 40b. The suction portion 40b is arranged so as to suck the injection particle from the side surface direction of the adsorption table 20, and thus can make it unlikely that the injection particle adheres to the rear surface Wr of the semiconductor element substrate W. The injection particle sucked and recovered by the recovery unit 13 is classified in the classifier 14. Of the injection particle classified in the classifier 14, only a reusable injection particle having a particle size of no less than a certain value is charged again in the reserve tank of the injection particle hopper 12 to be used. The suction portion 40b, which is directly connected to the recovery unit 13, thus has small duct wear and pressure loss, and can produce a large suction force to suck and recover the injection particle effectively.

The semiconductor element substrate W for which the injection treatment has been completed is conveyed to the exterior of the injection treatment chamber 40 from the housing port 40a of the injection treatment chamber 40 by the moving mechanism 30 (S18). At this time, the injection particle adhered to the semiconductor element substrate W is blown off by the cleaning mechanism 41 disposed on the nearer side of the housing port 40a to be sucked and removed. Here, because the interior of the injection treatment chamber 40 has a negative pressure, the injection particle and the like never leaks to the exterior from the housing port 40a.

Subsequently, the semiconductor element substrate W for which the injection treatment has been completed is conveyed to the measurement mechanism 51 by the conveying mechanism 52, and measured for the warp amount (S18, S20). In the control device 54, an accept/reject determination is performed as to whether the measured warp amount is no more than the previously set target warp amount. When it is determined that the measured warp amount is no more than the target warp amount, that is, within the permissible range of the target warp amount (accepted), the warp correction processing is completed, and the semiconductor element substrate W is conveyed by the conveying mechanism 52, and housed in a case 53 for processed semiconductor element substrates W (S22: Yes, S23). Subsequently, the conveying mechanism 52 takes out an unprocessed semiconductor element substrate W from the pre-processing case 53, and provides the same for a warp correction processing (injection treatment).

When it is determined in the control device 54 that the measured warp amount is greater than the target warp amount (rejected), injection treatment conditions are set based on the warp amount, and a warp correction processing is performed again (S22: No, S24: setting processing). That is, the foregoing steps of S14 to S20 are executed again. When the measured pass amount is still greater than the target warp amount even after the second warp correction processing, the semiconductor element substrate W may be disposed of as a reject. The yield can thereby be improved and the warp correction processing can be efficiently performed. In addition, it can be appropriately set up to how many times the warp correction processing is repeated. The operation shown in FIG. 7 is completed with the above.

In addition, the warp correction processing shown in FIG. 7 may also be performed at two separate stages of a coarse correction processing of setting injection treatment conditions based on a provisional target warp amount greater than the target warp amount to perform a warp correction processing (injection treatment) and a finish correction processing of setting injection treatment conditions based on the target warp amount after the coarse correction processing to perform a fine adjustment.

For example, when the target warp amount of a semiconductor element substrate W the pre-processing warp amount of which is 150 μm is set to no more than 20 μm, after setting such injection treatment conditions so as to attain a provisional target warp amount of no more than 50 m to perform injection treatment in the coarse correction processing and measuring the warp amount, injection treatment conditions for making the warp amount no more than 20 μm may be set to perform injection treatment again. The processing efficiency can thereby be improved in the coarse correction processing and the correction accuracy can be secured by the finish correction processing. In addition, the warp correction processing is completed without performing the finish correction processing when the warp amount falls within a predetermined range as a result of the coarse correction processing.

In the injection treatment, injection conditions such as the injection particle, injection speed, and injection pressure, scanning conditions for the semiconductor element substrate W, and other conditions are appropriately selected and set according to the semiconductor element substrate material, the quality and material of the semiconductor film, the warp amount, and others.

For example, a case of correcting a warp of a 4-inch sapphire substrate formed with a GaN-based compound semiconductor film will be mentioned in the following. The quality and material and others of the injection particle is any as long as it can give sufficient collision energy to the semiconductor element substrate W, but alumina abrasive grains that are 10 to 70 μm in average particle size can be preferably used. The surface roughness of the rear surface Wr of the semiconductor element substrate W may decline when the average particle size is excessively large, and when the average particle size is excessively small, the collision energy may become insufficient.

Moreover, the injection conditions are set by the injection pressure, injection amount, etc., in consideration of the type of the injection particle. For example, the injection pressure can be provided as 0.2 to 0.5 MPa, and more preferably, 0.2 to 0.4 Mpa. When the injection pressure is excessively high, cracks or the like of the semiconductor element substrate W may occur because the collision energy of the injection particle is excessively strong. When the injection pressure is excessively low, the time required for correcting the warp may increase because the collision energy is small. The injection amount can be provided as, for example, 100 to 400 g/min. A long time is required for meeting the coverage (injection density against the substrate) when the injection amount is excessively small, and when the injection amount is excessively great, the warp may not be sufficiently corrected because the coverage is met soon. Moreover, the injection amount depends on the feed amount of the injection particle to the nozzle. When the injection particle is fed to the nozzle in an excessively large amount in order to increase the injection amount, because the injection particle cannot be satisfactorily fed to the nozzle, the injection particle is injected in a pulsed manner, and warp correction may not be uniformly performed. The scanning conditions of the adsorption table 20 depend also on the type of the nozzle 11. For example, when a nozzle 11 the injection port 11e of which is in a rectangular shape of 15×4.8 mm is used, in consideration of the coverage, the relative moving speed of the adsorption table 20 can be selected from 5 to 200 mm/sec and a feed pitch of 20 mm can be set. However, because the range of the injection area FA of injecting from the nozzle 11 varies depending on the injection distance, it is necessary to select a feed pitch optimal for the injection distance.

For the semiconductor element substrate W a warp of which has been corrected by the warp correction apparatus 1, by forming a resist film and performing etching, a circuit pattern is formed on the semiconductor film (thin-film layer). For formation of a resist film, a photoresist has been generally used. Because a resist film is formed on the semiconductor element substrate W without a warp, the boundary of a circuit pattern can be clearly developed. Where the boundary of a circuit pattern has not been able to be clearly developed, a solid circuit pattern cannot be formed in the following etching step, which thus causes degradation in the quality of semiconductor elements. For example, in the case of an optical element such as an LED, the boundary that cannot be distinctly developed results in a non-uniform thickness of the semiconductor element to reduce brightness.

After the etching step, transparent electrodes, pad electrodes, a protection film, and others are formed on the compound semiconductor formed as a film. Then, scribe lines are formed by a laser or the like, and dicing into semiconductor elements (chips) is performed along said scribe lines. As a result of the warp being corrected, the electrode thickness can be made uniform, so that electrical resistivity can be reduced. The brightness can thereby be improved when light-emitting elements such as LEDs are fabricated. Moreover, because becoming out of focus in laser scribing is eliminated, defects in the dicing step can be reduced to improve yield.

In other steps of producing semiconductor elements from the semiconductor element substrate W, adverse effects a warp of the semiconductor element substrate W have on the characteristics, yield, etc., of semiconductor elements can be eliminated.

(Modification)

In the foregoing embodiment, the semiconductor element substrate W is relatively moved with respect to the fixed nozzle 11 by moving the adsorption table 20 by the moving mechanism 30, but the semiconductor element substrate W may be relatively moved with respect to the nozzle 11 by the nozzle 11 including another moving mechanism and scanning the nozzle 11 or by moving both the nozzle 11 and the adsorption table 20.

The semiconductor element substrate W includes, in the vicinity of an outer periphery thereof, a region where no semiconductor elements are formed, for example, a region that is 1 mm from the outermost periphery. Therefore, an arrangement can be adopted in which the adsorption portion 21 is provided at a position corresponding to at least said region by being formed in, for example, an annular shape, whereby making it possible to adsorb and hold the semiconductor element substrate W in said region. Thus, damage to the semiconductor elements due to entry of the injection particle can be prevented without providing the purge portion 23.

In the foregoing embodiment, the nozzle 11 is disposed so as to be capable of injecting substantially vertically with respect to the semiconductor element substrate W, but the nozzle 11 may be disposed in an inclined manner. For example, when the nozzle 11 is inclined to the side opposite to the recovery unit 13, the injection particle that has collided with the semiconductor element substrate W heads for the side of the recovery unit 13, and can thus be efficiently sucked and removed.

In the foregoing embodiment, the suction type nozzle 11 is used, but a pressure type (direct pressure type) nozzle can also be adopted which is for injecting the injection particle after quantifying the injection particle in the reserve tank of the injection particle hopper 12 by compressed air fed to the reserve tank. Moreover, the shape of the injection port 11e of the nozzle 11 is not limited to a rectangular shape, and various shapes including circular shapes can be used.

The injection treatment is performed for the entire rear surface Wr of the semiconductor element substrate W, but in such a case that the semiconductor element substrate W has a small warp, injection treatment can also be performed by performing stationary injecting to a center portion or the like of the semiconductor element substrate W.

Injection treatment may be performed before forming a semiconductor film on the semiconductor element substrate W to previously impart in the opposite direction a warp amount estimated to be produced after the film formation. A warp to be produced after formation of the semiconductor film can thereby be prevented.

In the abovementioned embodiment, a description has been given of the example in which a setting processing of injection treatment conditions and an accept/reject determination are performed, but only either one may be executed.

(Examples)

The results of correction of warps of semiconductor element substrates by the warp correction apparatus 1 according to the embodiment will be described as examples. In the present examples, three semiconductor element substrates W for each of which a 3 to 5 μm-level GaN-based compound semiconductor was formed as a film on a 4-inch diameter sapphire substrate having a thickness of 0.65 μm were prepared, and warps of said semiconductor element substrates W were corrected under the conditions of Table 1, using the warp correction apparatus described in the embodiment.

TABLE 1

| | |
|---|---|
| Nozzle diameter | 15.0 × 4.8 mm |
| Relative moving speed of adsorption table | 100 mm/sec |
| Feed pitch | 17 mm |
| Scan times | 2 passes |

Warp changes by scan time are shown in Table 2. Under any condition, the warp amount has been corrected to no more than 10 μm, and it has been found out that warps of the semiconductor element substrates can be corrected by the warp correction apparatus 1 according to the embodiment.

TABLE 2

| | Injection pressure (MPa) | Warp amount of substrate (μm) | |
|---|---|---|---|
| | | Before correction | After correction |
| Example 1 | 0.2 | 60.1 | 3.5 |
| Example 2 | 0.3 | 91.8 | 9.0 |
| Example 3 | 0.4 | 115.8 | 7.2 |

(Effects of Embodiment)

By the warp correction apparatus 1 and warp correction method for a semiconductor element substrate according to the embodiment, apparatus components of which including the injection mechanism 10 consist of means of low device costs and which can perform a warp correction processing in which appropriate injection treatment conditions are set based on a previously set target warp amount and warp data of the semiconductor element substrate W measured by the measurement mechanism 51 to correct a warp of the semiconductor element substrate W, a warp of the semiconductor element substrate W can thus be corrected efficiently by a method suitable for mass production. Moreover, a warp of the semiconductor element substrate W for which a warp correction processing has been performed can be measured by the measurement mechanism 51 to judge whether the warp is no more than a target warp amount, so that the yield can be improved and the warp correction processing can be efficiently performed.

REFERENCE SIGNS LIST

1 . . . warp correction apparatus, 10 . . . injection mechanism, 11 . . . nozzle, 11a . . . gas injection portion, 11b . . . feed port, 11c . . . mixing chamber, 11d . . . injection particle injection portion, 11e . . . injection port, 12 . . . injection particle hopper, 13 . . . recovery unit, 14 . . . classifier, 15 . . . dust collector, 20 . . . adsorption table, 21 . . . adsorption portion, 22 . . . negative pressure portion, 23 . . . purge portion, 24 . . . suction tube, 25 . . . purge tube, 30 . . . moving mechanism, 40 . . . injection treatment chamber, 40a . . . housing port, 40b . . . suction portion, 40c . . . wall portion, 41 . . . cleaning mechanism, 51 . . . measurement mechanism, 52 . . . conveying mechanism, 53 . . . case, 54 . . . control device, W . . . semiconductor element substrate, Ws . . . film surface, Wr . . . rear surface, FA . . . injection particle injection area.

The invention claimed is:

1. A warp correction apparatus that corrects a warp of a semiconductor element substrate, the warp correction apparatus comprising:
   an injection mechanism having a nozzle that performs injection treatment of injecting an injection particle to a rear surface that is opposite to a principal surface or opposite to a film surface in the semiconductor element substrate;
   an adsorption table that adsorbs the principal surface or the film surface of the semiconductor element substrate to hold the semiconductor element substrate;
   a moving mechanism that moves the adsorption table so that the semiconductor element substrate relatively moves with respect to an injection area of the injection particle by the nozzle;
   an injection treatment chamber that houses the semiconductor element substrate held on the adsorption table and in an interior of which injection treatment is performed;
   a measurement mechanism that measures a warp amount of the semiconductor element substrate; and
   a control device that, based on a difference between a previously set target warp amount and a warp amount of the semiconductor element substrate measured by the measurement mechanism, performs at least either one of a setting processing of an injection treatment condition of the injection mechanism and an accept/reject determination of the semiconductor element substrate for which injection treatment has been performed.

2. The warp correction apparatus for a semiconductor element substrate according to claim 1, wherein
   the adsorption table includes:
   an adsorption portion that is provided in a region where the semiconductor element substrate is to be placed, and adsorbs and fixes the semiconductor element substrate; and
   a purge portion that is provided in the region and at an outer edge side of the region further than the adsorption portion, and injects compressed air toward outside the region from a clearance formed between an outer edge of the semiconductor element substrate and the adsorption table.

3. The warp correction apparatus for a semiconductor element substrate according to claim 1, wherein the adsorption table includes an adsorption portion that is provided at a position corresponding to at least a region that is an outer edge of the semiconductor element substrate and where no semiconductor elements are formed, and adsorbs and fixes the semiconductor element substrate.

4. The warp correction apparatus for a semiconductor element substrate according to claim 1, wherein at least either one of the injection mechanism and the adsorption table relatively scans the semiconductor element substrate with respect to the injection area of the injection particle by the nozzle so that the injection particle is injected over the entire rear surface of the semiconductor element substrate.

5. The warp correction apparatus for a semiconductor element substrate according to claim 1, wherein
   in one side surface of the injection treatment chamber, a suction portion that sucks and removes an injection particle is provided,
   in the other side surface of the injection treatment chamber, an opening portion through which the adsorption table holding the semiconductor element substrate passes is formed, and
   the opening portion is opened at a size that forms a gap to suck outside air with the adsorption table or the semiconductor element substrate when the adsorption table holding the semiconductor element substrate is inserted.

6. The warp correction apparatus for a semiconductor element substrate according to claim 5, wherein the interior of the injection treatment chamber is partitioned by a wall portion formed with a slit not to obstruct a movement of the semiconductor element substrate.

7. The warp correction apparatus for a semiconductor element substrate according to claim 6, wherein the adsorption table is arranged so as to be movable in a horizontal plane by the moving mechanism,
   the wall portion is coupled at both end portions thereof in a vertical direction with an upper surface and a bottom portion of the injection treatment chamber as well as disposed surrounding the injection area of the nozzle, and
   the slit is formed at a position to overlap a horizontal plane in which the adsorption table is movable.

8. The warp correction apparatus for a semiconductor element substrate according to claim 5, comprising a cleaning mechanism that is provided on a side surface of an opening portion side of the injection treatment chamber, and for removing the injection particle adhered to the semiconductor element substrate.

9. The warp correction apparatus for a semiconductor element substrate according to claim 1, wherein the control device causes the injection mechanism to operate so as to perform injection treatment again when having judged, in the accept/reject determination, that a warp of a semiconductor element substrate for which injection treatment has been performed is greater than the target warp amount.

10. The warp correction apparatus for a semiconductor element substrate according to claim 1, wherein the control device causes the injection mechanism to operate so as to perform a coarse correction processing of setting the injection treatment condition based on a provisional target warp amount greater than a target warp amount to perform injection treatment and a finish correction processing of setting the injection treatment condition based on the target warp amount after the coarse correction processing to perform injection treatment.

11. The warp correction apparatus for a semiconductor element substrate according to claim 2, wherein at least either one of the injection mechanism and the adsorption table relatively scans the semiconductor element substrate with respect to the injection area of the injection particle by the nozzle so that the injection particle is injected over the entire rear surface of the semiconductor element substrate.

12. The warp correction apparatus for a semiconductor element substrate according to claim 3, wherein at least either one of the injection mechanism and the adsorption table relatively scans the semiconductor element substrate with respect to the injection area of the injection particle by the nozzle so that the injection particle is injected over the entire rear surface of the semiconductor element substrate.

\* \* \* \* \*